(12) United States Patent
Park

(10) Patent No.: US 8,263,448 B2
(45) Date of Patent: Sep. 11, 2012

(54) THIN FILM TRANSISTOR WITH CONTACT HOLES HAVING DIFFERENT WIDTHS AND METHOD OF MANUFACTURING THE SAME

(75) Inventor: Jae-Bum Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 79 days.

(21) Appl. No.: 13/023,361

(22) Filed: Feb. 8, 2011

(65) Prior Publication Data

US 2011/0129968 A1 Jun. 2, 2011

Related U.S. Application Data

(62) Division of application No. 12/314,506, filed on Dec. 11, 2008, now Pat. No. 7,888,682.

(30) Foreign Application Priority Data

Jul. 8, 2008 (KR) .................. 10-2008-0065817

(51) Int. Cl.
*H01L 21/335* (2006.01)
(52) U.S. Cl. ................ 438/164; 257/E21.409
(58) Field of Classification Search .......... 438/151, 438/164, 181; 257/E21.409
See application file for complete search history.

(56) References Cited

U.S. PATENT DOCUMENTS

| 6,275,275 | B1 | 8/2001 | Ha |
| 6,340,830 | B1* | 1/2002 | Takemura ............ 257/350 |
| 2003/0189207 | A1 | 10/2003 | Murakami et al. |
| 2006/0060852 | A1 | 3/2006 | Yamazaki et al. |
| 2007/0241334 | A1* | 10/2007 | Nagata ............... 257/66 |

OTHER PUBLICATIONS

English translation of Office Action from German Patent and Trademark Office dated Feb. 10, 2012 in a German counterpart application.

* cited by examiner

*Primary Examiner* — Wensing Kuo
(74) *Attorney, Agent, or Firm* — Morgan, Lewis & Bockius LLP

(57) ABSTRACT

A thin film transistor comprises a substrate; a semiconductor layer disposed on the substrate, the semiconductor layer having a source region, a drain region, and a channel region between the source region and the drain region; a gate insulating layer disposed on the semiconductor layer and on the substrate; a gate electrode disposed on the insulating layer over the channel region; an passivation layer disposed on the gate electrode and the gate insulating layer; a source electrode disposed in contact with upper, lower and side surfaces of the source region via a first contact hole through passivation layer, the gate insulating layer and the semiconductor layer; and a drain electrode disposed in contact with upper, lower and side surfaces of the drain region via a second contact hole through the passivation layer, the gate insulating layer and the semiconductor layer.

22 Claims, 10 Drawing Sheets

THIN FILM TRANSISTOR WITH CONTACT HOLES HAVING DIFFERENT WIDTHS AND METHOD OF MANUFACTURING THE SAME

This is a divisional of U.S. patent application Ser. No. 12/314,506, filed Dec. 11, 2008 now U.S. Pat. No. 7,888,862, which is hereby incorporated by reference. This application also claims the benefit of Korean Patent Application No. 10-2008-0065817 filed in Korea on Jul. 8, 2008, which is hereby incorporated by reference.

BACKGROUND OF THE INVENTION

1. Field of the Invention

The invention relates to a thin film transistor, and more particularly, a thin film transistor having polycrystalline silicon as an active layer and a method of manufacturing the same.

2. Discussion of the related Art

Recently, with growing interest regarding information display and an increasing demand for portable media, flat panel display (FPD) devices—with advantages of being thin, light weight and low in power consumption—have been developed and have replaced cathode ray tubes (CRTs). Among theses FPD devices, active matrix liquid crystal display (AM-LCD) devices with their light weight, thin profile and low power consumption have been widely used for notebooks and personal computer monitors because of their superior display quality. An AM-LCD device includes a plurality of pixel regions and thin film transistors, each of which is used as a switching element controlling a voltage applied to a liquid crystal layer of each pixel region to change transmittance of corresponding pixel region.

A liquid crystal display (LCD) device includes a liquid crystal panel displaying images and a driving unit supplying signals to the liquid crystal panel. The liquid crystal panel includes two substrates facing each other and spaced apart from each other with a liquid crystal layer between the two substrates. The two substrates are often referred to as an array substrate and a color filter substrate, respectively. The array substrate includes a plurality of gate lines parallel to each other, a plurality of data lines crossing the plurality of gate lines to define a plurality of pixel regions, a plurality of thin film transistors (TFTs) each connected to each gate line and each data line, and a plurality of pixel electrodes respectively connected to the plurality of TFTs.

A TFT used as a switching element of an LCD device may be classified into an amorphous silicon type and a polycrystalline silicon type according to a phase state of an active layer. Since a TFT using polycrystalline silicon as an active layer has a carrier mobility ten times to a hundred times greater than a TFT using amorphous silicon as an active layer, a driving circuit including the polycrystalline silicon TFTs is more commonly formed for the array substrate. As a result, polycrystalline silicon TFTs may be used as switching elements and driving elements for a next generation display panel having high resolution.

In addition, polycrystalline silicon TFTs may be applied to organic electroluminescent display (OELD) devices, which may alternatively be referred to as organic light emitting diode (OLED) devices, as switching elements. An OELD device includes first and second electrodes and an emitting layer between the first and second electrodes. Electrons and holes are injected into the emitting layer from the first and second electrodes, respectively, and the emitting layer emits light when excitons generated from combination of the electrons and the holes are transited from an excited state to a ground state. Since the OELD device is self emissive and does not require an additional light source, the OELD device has reduced volume and weight.

Hereinafter, a method of manufacturing an array substrate including a polycrystalline silicon thin film transistor according to the related art will be described with reference to accompanying drawings. FIGS. 1A to 1D are cross-sectional views schematically illustrating a method of manufacturing a polycrystalline silicon thin film transistor according to the related art.

In FIG. 1A, a semiconductor area BA, a switching area SA and a pixel region PA are defined on a substrate 10. A semiconductor layer will be formed in the semiconductor area BA, and a thin film transistor will be formed in the switching area SA. The pixel region PA is defined by crossing a gate line and a data line. The semiconductor area BA includes a source area S, a drain area D, and a channel area C. A buffer layer 20 is formed on the substrate 10, where the areas BA, SA, and PA are defined. The buffer layer 20 is formed of an inorganic insulating material group, such as silicon oxide ($SiO_2$) or silicon nitride ($SiN_x$).

Next, an amorphous silicon layer (not shown) is formed on the buffer layer 20 by depositing amorphous silicon (a-Si:H) using a plasma chemical vapor deposition (PCVD) method. The amorphous silicon layer is crystallized and then patterned, thereby forming an active layer 40 in the switching area SA. The buffer layer 20 prevents the amorphous silicon layer from being contaminated by impurities included in the substrate 10 while depositing the amorphous silicon by the PCVD method and crystallizing the amorphous silicon layer. The amorphous silicon layer may be crystallized by an excimer laser annealing (ELA) method, a solid phase crystallization (SPC) method, a sequential lateral solidification (SLS) method, a metal induced crystallization (MIC) method, a metal induced lateral crystallization (MILC) method, or an alternative magnetic lateral crystallization (AMLC) method.

In FIG. 1B, a gate insulating layer 45 is formed on the active layer 40 of FIG. 1A. The gate insulating layer 45 is formed of one selected from an inorganic insulating material group including silicon oxide ($SiO_2$) and silicon nitride ($SiN_x$).

Next, a gate line (not shown) and a gate electrode 25 are formed on the gate insulating layer 45 by forming a gate metallic layer (not shown) and then patterning it. The gate line will be used to supply scan signals. The gate electrode 25 extends from the gate line and overlaps the channel area C. The gate line and the gate electrode 25 are formed of a conductive metallic material group, such as copper (Cu), molybdenum (Mo), aluminum (Al), or aluminum alloy, for example, aluminum neodymium (AlNd). The gate electrode 25 is used as an ion stopper, and a step of highly doping n-type or p-type ions into the active layer 40 of FIG. 1A is performed, thereby forming a semiconductor layer 42 that includes a channel portion 42a, a first doped portion 42b and a second doped portion 42c. The channel portion 42a is disposed under the gate electrode 25 and does not include impurities. The first doped portion 42b and the second doped portion 42c correspond to the source and drain areas S and D, respectively, and include n-type or p-type ions.

Next, a passivation layer 55 is formed substantially on the entire surface of the substrate 10 including the gate line and the gate electrode 25. The passivation layer 55 is formed of one selected from an inorganic insulating material group including silicon oxide ($SiO_2$) and silicon nitride ($SiN_x$) or an organic insulating material group including photo acryl and benzocyclobutene (BCB).

In FIG. 1C, to expose the first and second doped portions 42b and 42c, the passivation layer 55 and the gate insulating layer 45 corresponding to the source and drain areas S and D are sequentially patterned, and thus, a source hole SH and a drain hole DH are formed. The source hole SH exposes the first doped portion 42b in the source area S, and the drain hole DH exposes the second doped portion 42c in the drain area D.

In FIG. 1D, a data line (not shown), a source electrode 32 and a drain electrode 34 are formed on the passivation layer 55 including the source and drain holes SH and DH. The data line perpendicularly crosses the gate line to define the pixel region PA. The source electrode 32 extends from the data line and contacts the first doped portion 42b through the source hole SH. The drain electrode 34 is spaced apart from the source electrode 32 and contacts the second doped portion 42c through the drain hole DH.

An interlayer insulating layer 65 is formed on the substrate 10 including the source and drain electrodes 32 and 34. The interlayer insulating layer 65 includes a drain contact hole DCH exposing the drain electrode 34. The interlayer insulating layer 65 is formed of an inorganic insulating material group, such as silicon oxide ($SiO_2$) or silicon nitride ($SiN_X$), or an organic insulating material group, such as photo acryl or benzocyclobutene (BCB). A pixel electrode 70 is formed in the pixel region PA on the interlayer insulating layer 65 and is connected to the drain electrode 34 through the drain contact hole DCH.

In this manner, the related art polycrystalline silicon thin film transistor can be manufactured. In the above-mentioned process, the source and drain holes SH and DH, which expose the first and second doped portions 42b and 42c corresponding to the source and drain areas S and D, respectively, are formed by a dry-etching method using a plasma dry-etching apparatus. This will be explained hereinafter in more detail with reference to accompanying drawings.

FIG. 2 is a cross-sectional view schematically illustrating a plasma dry-etching apparatus according to the related art. In FIG. 2, the related art plasma dry-etching apparatus 71 includes a chamber 72, a susceptor 80 and an upper electrode 90. The chamber 72 is kept under a vacuum condition. A reactive gas supply unit 84 is formed at one side of a lower part of the chamber 72 and is spaced apart from the susceptor 80. An exhaust unit 88 is formed at another side of the lower part of the chamber 72 and is spaced apart from the reactive gas supply unit 84. The susceptor 80 is disposed in the chamber 72 and functions as a lower electrode. A substrate 10 is disposed on an upper surface of the susceptor 80. The upper electrode 90 is spaced apart from and faces the susceptor 80 in the chamber 72. A ceramic plate 92 is attached at a lower surface of the upper electrode 90.

A space between the susceptor 80 and the upper electrode 90 is defined as a reaction region A under a plasma state. Although not shown in FIG. 2, reactive gases are uniformly injected into the reaction region A by the reactive gas supply unit 84, and residues left after reaction are exhausted outside the chamber 72 through the exhaust unit 88.

Generally, a dry-etching method uses physical reaction due to ion impacts on a surface of the substrate 10, and chemical reaction between reactive materials generated in the plasma or physical and chemical reaction may be used. The chemical dry-etching method is performed by supplying reactive radicals generated in the plasma to a surface of a material to be etched and then forming volatile gases due to the chemical reaction occurring between reactive radicals and atoms at the surface. Since the chemical dry-etching method is an isotropic etching method and the reactor is under vacuum, it is advantageous that volatile gases easily move at the surface.

FIGS. 3A and 3B are cross-sectional views illustrating a step of forming source and drain holes according to the related art. The step of forming the source and drain holes will be explained in greater detail with reference to FIG. 2.

In FIG. 2 and FIG. 3A, a buffer layer 20, a semiconductor layer 42, a gate insulating layer 45, a gate electrode 25 and a passivation layer 55 are sequentially formed on a substrate 10. Source and drain holes SH and DH exposing first and second doped portions 42b and 42c are formed by removing the passivation layer 55 and the gate insulating layer 25. The source and drain holes SH and DH may be formed by a dry-etching method or a wet-etching method. Since there is a limitation of forming fine and minute patterns by the wet-etching method, the source and drain holes SH and DH are mostly formed by the dry-etching method.

Here, photoresist is applied to the passivation layer 55 to form a photoresist layer (not shown), and the photoresist layer is exposed to light through a mask (not shown), which is disposed over the substrate 10 and includes a light-transmitting portion and a light-blocking portion. Then, the photoresist layer is developed and selectively patterned to correspond to source and drain areas S and D, and photoresist patterns 62 are formed. The passivation layer 55 exposed by the photoresist patterns 62 are dry-etched by the dry-etching apparatus of FIG. 2.

The step of forming the source and drain holes SH and DH by sequentially patterning the passivation layer 55 and the gate insulating layer 45 thereunder by the dry-etching method is divided into a first etch step using first reaction gases and a second etch step using second reaction gases. The first reaction gases may include sulfur hexafluoride ($SF_6$) and argon (Ar). The first reaction gases react well with the passivation layer 55, the gate insulating layer 45 and the semiconductor layer 42, that is, silicon nitride ($SiN_X$), silicon oxide ($SiO_2$) and silicon (Si). The second reaction gases may include fluorocarbons ($C_XF_Y$), argon (Ar) and hydrogen ($H_2$), and more particularly, may include hexafluorobutadiene ($C_4F_6$). The second reaction gases react well with the passivation layer 55 and the gate insulating layer 45, that is, silicon nitride ($SiN_X$) and silicon oxide ($SiO_2$), and scarcely react with silicon (Si) of the semiconductor layer 42.

For example, when a thickness t1 of the passivation layer 55 is 4300 Å (Angstroms), and a thickness t2 of the gate insulating layer 45 is 300 Å (Angstroms), the passivation layer 55 corresponding to the source and drain areas S and D is completely patterned by the first reaction gases. Next, in FIG. 3B, the gate insulating layer 45 having the thickness t2 of 300 Å (Angstroms), under the passivation layer 55 is selectively patterned by the second reaction gases, and the semiconductor layer 42 corresponding to the source and drain areas S and D is exposed. At this time, the gate insulating layer 45 may be partially etched by the first reaction gases. After the dry-etching, remaining photoresist patterns 52 may be removed by a stripping process using etchant.

The two patterning process by the first reaction gases and the second reaction gases prevents the semiconductor layer from being damaged. More particularly, if the passivation layer 55 and the gate insulating layer 45 are patterned by only the first reaction gases, the semiconductor layer 42 under the gate insulating layer 45 may be removed together due to properties of the first reaction gases. Since removal of the semiconductor layer 42 by the first reaction gases reduces reliability of the semiconductor layer 42, the passivation layer 55 is patterned by the first reaction gases, and the gate insulating layer 45 is patterned by the second reaction gases that do not react with the semiconductor layer 42, thereby preventing the semiconductor layer 42 from being damaged.

However, the step of forming the source and drain holes SH and DH by the first reaction gases and the second reaction gases increases manufacturing time and costs, and production yield is lowered. In addition, the second reaction gases for selectively exposing the semiconductor layer 42 actively react with polymer materials in the chamber 72 and by-products BP are generated. The by-products BP may stick to an inner wall 74 of the chamber 72. When the gate insulating layer 45 is dry-etched by the second reaction gases, the by-products BP or particles sticking to the inner wall 74 of the chamber 72 may fall onto the substrate 10 due to high frequency voltages and stop the source and drain holes SH and DH. That is, a contact problem wherein the semiconductor layer 42 is not exposed by the by-products or particles may be caused. Accordingly, the inner wall 74 of the chamber 72 must be cleaned and changed periodically. The cleaning and changing are very expensive and reduce operation efficiency. Therefore, the production yield decreases rapidly.

FIG. 4 is a graph illustrating an increase of by-products or particles according to the number of substrates. In FIG. 4, the change of particles is shown as a function of the number of substrates supplied for forming source and drain holes. A first step is a step of initially ashing, a second step is a step of dry-etching using first reaction gases, and a third step is a step of dry-etching using second reaction gases. At this time, in the first and second steps, by-products or particles are slightly changed according as the number of substrates increases, and in the third step, the by-products or particles are rapidly increased. As shown by the experimental data, the inner wall of the chamber is contaminated by the dry etch using the second reaction gases when the source and drain holes are formed.

SUMMARY OF THE INVENTION

Accordingly, the present invention is directed to a thin film transistor and a method of manufacturing the same that substantially obviate one or more of the problems due to limitations and disadvantages of the related art.

An object of the present invention is to provide a thin film transistor and a method of manufacturing the same that improves production yields by preventing contact problems due to by-products or particles at an inner surface of a chamber.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor comprises a substrate; a semiconductor layer disposed on the substrate, the semiconductor layer having a source region, a drain region, and a channel region between the source region and the drain region; a gate insulating layer disposed on the semiconductor layer and on the substrate; a gate electrode disposed on the insulating layer over the channel region; an passivation layer disposed on the gate electrode and the gate insulating layer; a source electrode disposed in contact with upper, lower and side surfaces of the source region via a first contact hole through passivation layer, the gate insulating layer and the semiconductor layer; and a drain electrode disposed in contact with upper, lower and side surfaces of the drain region via a second contact hole through the passivation layer, the gate insulating layer and the semiconductor layer.

In another aspect, a thin film transistor comprises a substrate; a semiconductor layer on the substrate and including a channel portion and first and second doped portions at respective sides of the channel portion, wherein the first and second doped portions include openings having a first width and second widths, respectively; a gate insulating layer on the semiconductor layer; a gate electrode on the gate insulating layer over the channel portion; a passivation layer on the gate electrode and including source and drain holes with the gate insulating layer, wherein the source and drain holes respectively expose the first and second doped portions and have a third and fourth widths, respectively, wider than the first and second widths, respectively; source and drain electrodes on the passivation layer, the source electrode connected to the first doped portion through the source hole, and the drain electrode connected to the second doped portion through the drain holes.

In another aspect, a method of manufacturing a thin film transistor comprises forming a silicon layer on a substrate; forming a gate insulating layer on the silicon layer and the substrate; forming a gate electrode on the gate insulating layer over the silicon layer; and implanting impurities into the silicon layer to define source and drain regions and to define a channel region under the gate electrode; forming a passivation layer on the gate electrode and the gate insulating layer; performing a first etch process to form first and second contact hole through the passivation layer, the gate insulating layer, and the silicon layer; performing a second etch process to widen the first and second contact holes at the passivation layer and the gate insulating layer by an amount greater than at the silicon layer; forming a source electrode in contact with the source region via the first contact hole; and forming a drain electrode in contact with the drain region via the second contact hole.

In another aspect, a method of fabricating a thin film transistor comprises forming a silicon layer on a substrate; forming a gate insulating layer on the active layer; forming a gate electrode on the gate insulating layer over the active layer; doping the silicon layer with impurities to form a semiconductor layer including a channel portion under the gate electrode and first and second doped portions respective disposed at sides of the channel portion; forming a passivation layer on the semiconductor layer; forming source and drain holes by patterning the passivation layer, the gate insulating layer and the first and second doped portions, wherein the source hole has a first width at the first doped portion and a second width at the gate insulating layer with the second width being greater than the first width, and wherein the drain hole has a third width at the second doped portion and a fourth width at the gate insulating layer with the fourth width being greater than the third width; and forming source and drain electrodes on the passivation layer, the source electrode connected to the first doped portion through the source hole, and the drain electrode connected to the second doped portion through the drain hole.

In another aspect, a method of fabricating an array substrate for a liquid crystal display device comprises forming a silicon layer on a substrate; forming a gate insulating layer on the active layer; forming a gate line and a gate electrode on the gate insulating layer, the gate electrode connected to the gate line and disposed over the active layer; doping the silicon layer with impurities to form a semiconductor layer including a channel portion under the gate electrode and first and second doped portions respective disposed at sides of the channel portion; forming a passivation layer on the semiconductor layer; forming source and drain holes by patterning the passivation layer, the gate insulating layer and the first and second doped portions, wherein the source hole has a first width at the first doped portion and a second width at the gate insulating layer with the second width being greater than the first width, and wherein the drain hole has a third width at the second doped portion and a fourth width at the gate insulating layer with the fourth width being greater than the third width; forming a data line and source and drain electrodes on the passivation layer, the data line crossing the gate line to define a pixel region, the source electrode extending from the data line and connected to the first doped portion through the source hole, and the drain electrode spaced apart from the source electrode and connected to the second doped portion through the drain hole; forming an interlayer insulating layer on the data line, the source electrode and the drain electrode, the interlayer insulating layer including a drain contact hole exposing the drain electrode; and forming a pixel electrode on the interlayer insulating layer, the pixel electrode being connected to the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to embodiments of the present invention, examples of which are illustrated in the accompanying drawings.

In accordance with the present invention, a polycrystalline silicon thin film transistor of a top-gate type has a side contact structure, and thus process efficiency is improved. Moreover, generation of by-products or particles sticking to an inner wall of a chamber is minimized, and a contact problem between a semiconductor layer and source and drain electrodes are prevented.

Figure 1A:
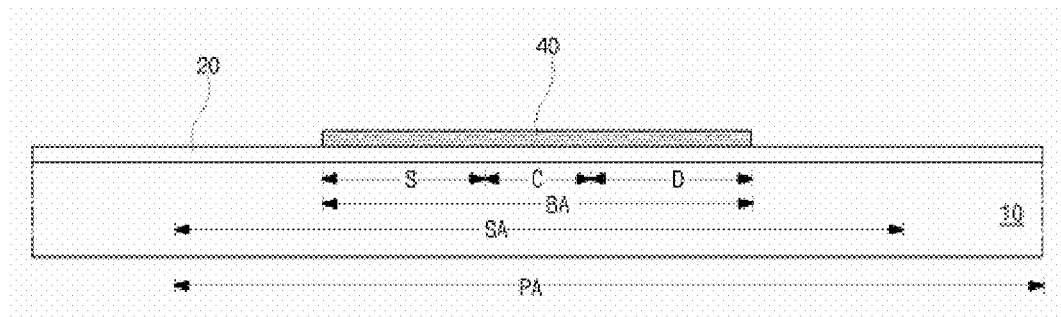
FIGS. 1A to 1D are cross-sectional views schematically illustrating a method of manufacturing a polycrystalline silicon thin film transistor according to the related art.
Figure 1B:
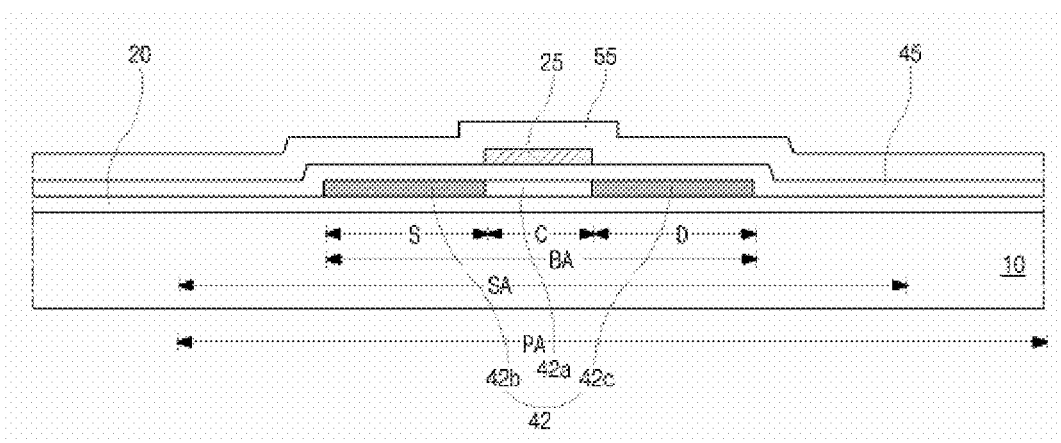
Figure 1C:
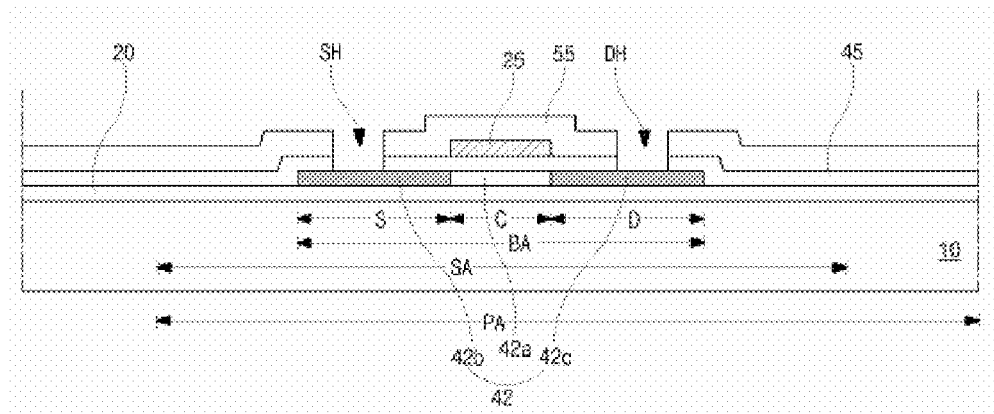
Figure 1D:
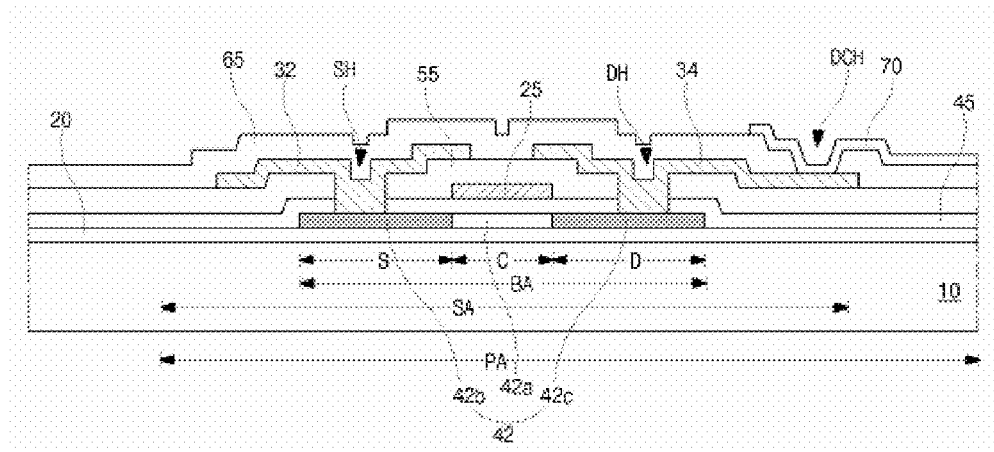
Figure 2:
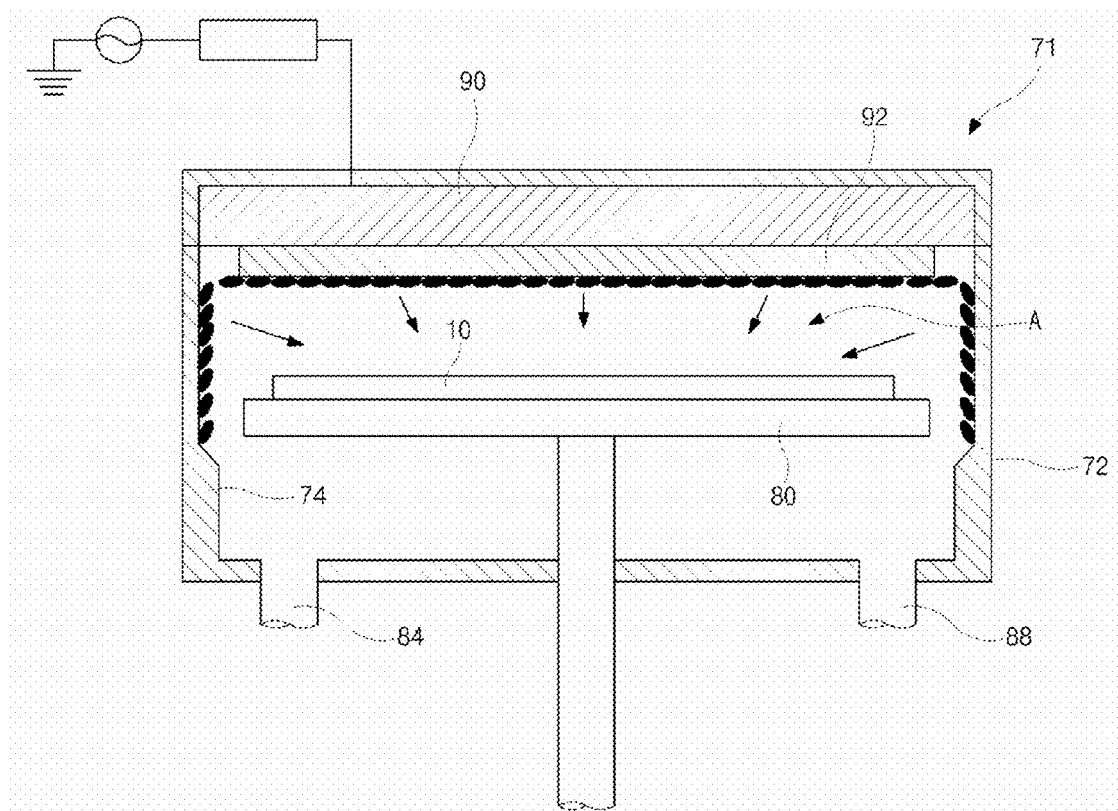
FIG. 2 is a cross-sectional view schematically illustrating a plasma dry-etching apparatus according to the related art.
Figure 3A:
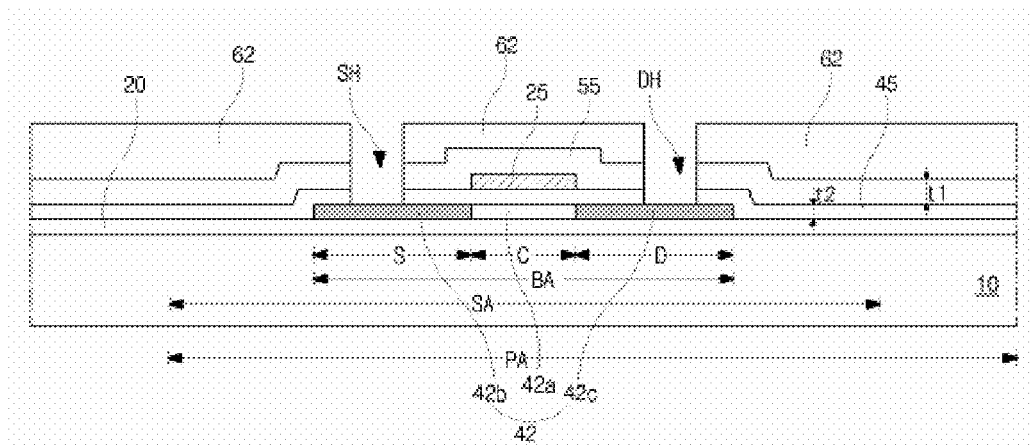
FIGS. 3A and 3B are cross-sectional views illustrating a step of forming source and drain holes according to the related art.
Figure 3B:
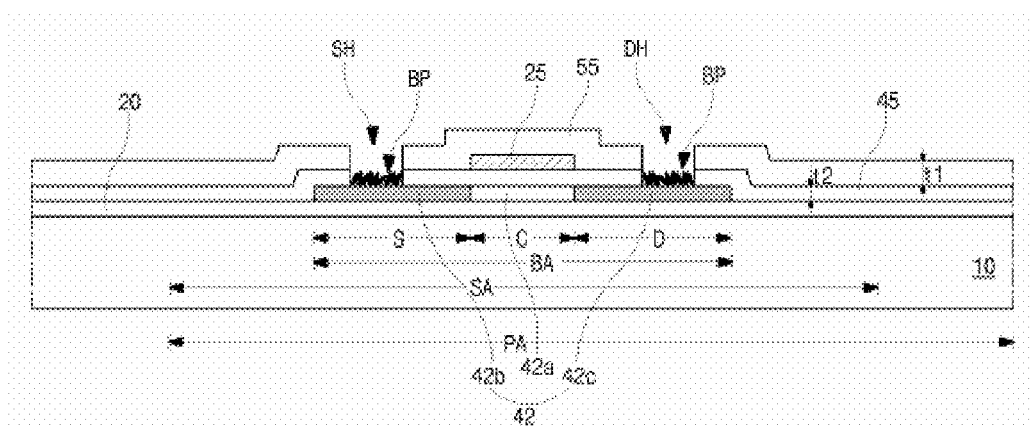
Figure 4:
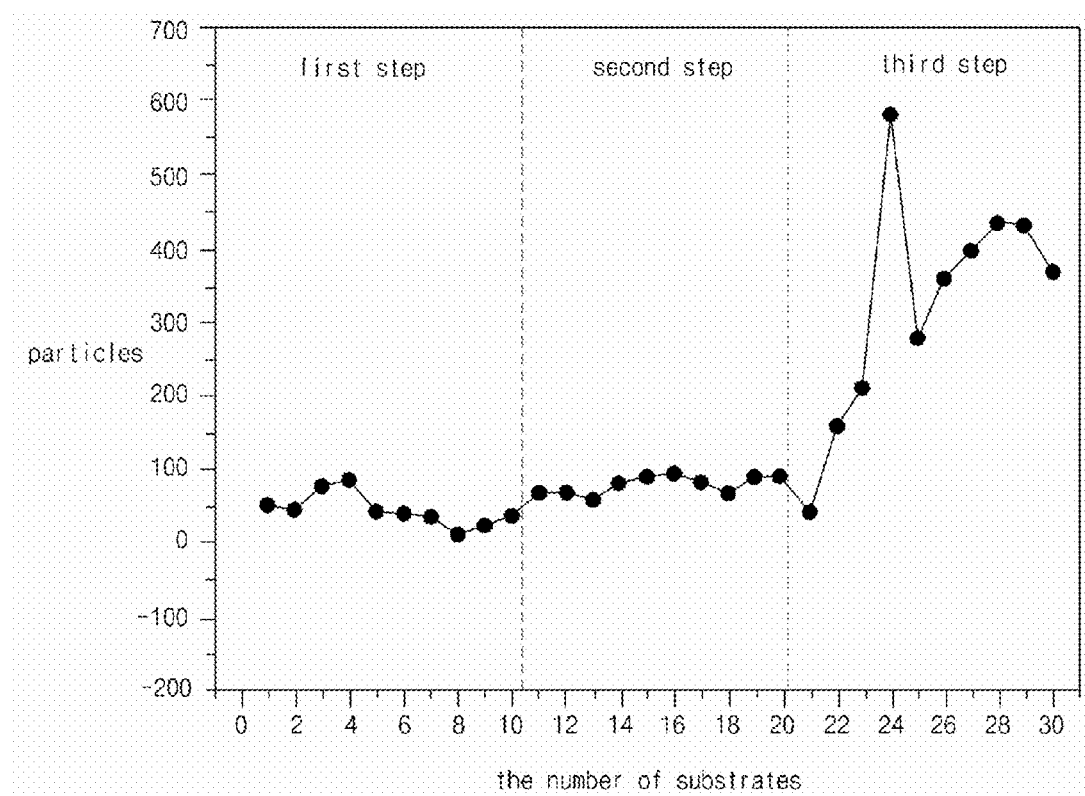
FIG. 4 is a graph illustrating an increase of by-products or particles according to the number of substrates according to the related art.
Figure 5:
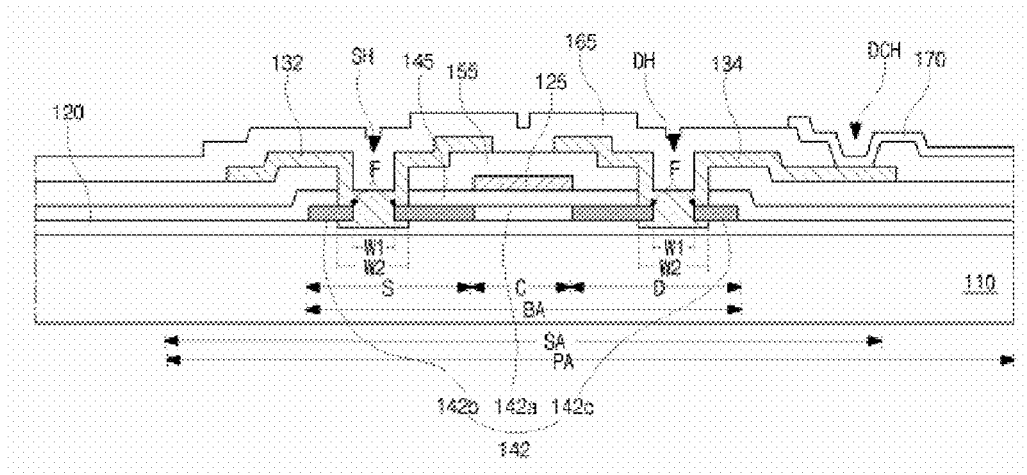
FIG. 5 is a cross-sectional view illustrating a thin film transistor according to an exemplary embodiment of the present invention.

FIG. 5 is a cross-sectional view illustrating a thin film transistor according to an exemplary embodiment of the present invention. The thin film transistor may include polycrystalline silicon as an active layer.

In FIG. 5, a buffer layer 120 is formed on a substrate 110 including a semiconductor area BA, a switching area SA, and a pixel region PA. The semiconductor area BA includes a source area S, a drain area D, and a channel area C. A semiconductor layer 142 is formed on the buffer layer 120 in the semiconductor area BA. The semiconductor layer 142 includes a channel portion 142a, which does not have impurities and corresponds to the channel area C, and first and second doped portions 142b and 142c, which have one of negative- and positive-type impurities and correspond to the source and drain areas S and D, respectively. The first and second doped portions 142b and 142c are disposed at both sides of the channel portion 142a. The first and second doped portions 142b and 142c include openings having a first width W1. A gate insulating layer 145 is formed on the semiconductor layer 142 and covers the semiconductor layer 142. A gate electrode 125 is formed on the gate insulating layer 145 over the channel portion 142a of the semiconductor layer 142. A passivation layer 155 is formed on the gate electrode 125 and covers the gate electrode 125. Source and drain holes SH and DH corresponding to the source and drain areas S and D, respectively, are formed in the passivation layer 155 and the gate insulating layer 145. The source and drain holes SH and DH expose the first and second doped portions 142b and 142c, respectively, and have a second width W2 wider then the first width W1. Source and drain electrodes 132 and 134 are formed on the passivation layer 155. The source and drain electrodes 132 and 134 are spaced apart from each other. The source electrode 132 is connected to the first doped portion 142b through the source hole SH, and the drain electrode 134 is connected to the second doped portion 142c through the drain hole DH. The source electrode 132 contacts three surfaces of the first doped portion 142b, that is, upper, lower and side surfaces of the first doped portion 142b, and the drain electrode 134 contacts three surfaces of the second doped portion 142c, that is, upper, lower and side surfaces of the second doped portion 142c. An interlayer insulating layer 165 is formed on the source and drain electrodes 132 and 134. The interlayer insulating layer 165 includes a drain contact hole DCH exposing the drain electrode 134. A pixel electrode 170 is formed on the interlayer insulating layer 165. The pixel electrode 170 is connected to the drain electrode 134 through the drain contact hole DCH.

The semiconductor layer 142 may be formed by depositing amorphous silicon (a-Si:H) layer (not shown), crystallizing the amorphous silicon layer to form a polycrystalline silicon layer, and doping the polycrystalline silicon layer. The amorphous silicon layer may be crystallized using one of a solid phase crystallization (SPC) method, a sequential lateral solidification (SLS) method, a metal induced crystallization (MIC) method, a metal induced lateral crystallization (MILC) method, and an alternative magnetic lateral crystallization (AMLC) method.

Further, the buffer layer 120 prevents contamination of the semiconductor layer 142 due to impurities from the substrate 110 during the deposition and crystallization steps for the amorphous silicon layer. The semiconductor layer 142, the gate electrode 125, the source electrode 132 and the drain electrode 134 form a thin film transistor (TFT).

In accordance with the present invention, the source and drain holes SH and DH having the second width W2 wider than the first width W1 are formed in the passivation layer 155 and the gate insulating layer 145 corresponding to the source and drain areas S and D and expose the first and second doped portions 142b and 142c of the semiconductor layer 142.

More particularly, the first and second doped portions 142b and 142c have protrusions F going beyond the passivation layer 155 and the gate insulating layer 145 and exposed by the source and drain holes SH and DH that have the second width W2 wider than the first width W1. The protrusions F increase contact areas between the first doped portion 142b and the source electrode 132 and between the second doped portion 142c and the drain electrode 134. Accordingly, even though the source and drain electrodes 132 and 134 make side contact with the first and second doped portions 142b and 142c of the semiconductor layer 142, driving properties of the thin film transistor are not affected. Formation of the protrusions F will be described in more detail later.

FIGS. 6A to 6I are cross-sectional views illustrating a method of manufacturing a thin film transistor according to an exemplary embodiment of the present invention.

Figure 6A:
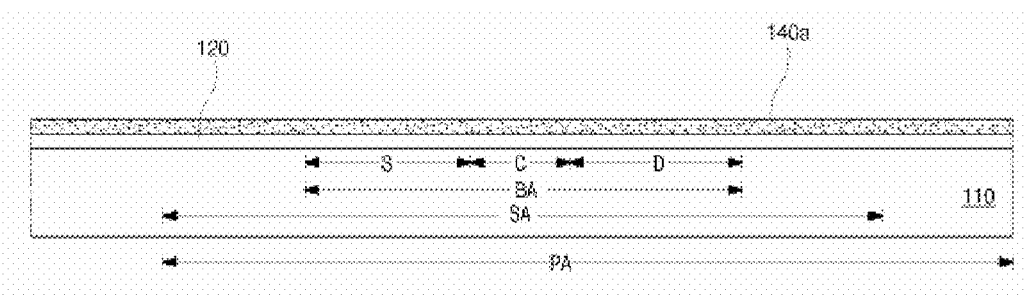
FIGS. 6A to 6I are cross-sectional views illustrating a method of manufacturing a thin film transistor according to an exemplary embodiment of the present invention.

In FIG. 6A, a buffer layer 120 is formed on a substrate 110 having a semiconductor area BA, a switching area SA and a pixel region PA by depositing one inorganic insulating material group, such as silicon oxide ($SiO_2$) or silicon nitride ($SiN_X$). The pixel region PA, which is a unit for displaying images, may include the switching area SA for a thin film transistor (TFT). The switching area SA may include a semiconductor area BA for an active layer. The semiconductor area BA includes a source area S, a drain area D, and a channel area C. Next, an amorphous silicon layer 140a is formed on the buffer layer 120 by depositing amorphous silicon (a-Si:H) by a plasma chemical vapor deposition (PCVD) method.

Figure 6B:
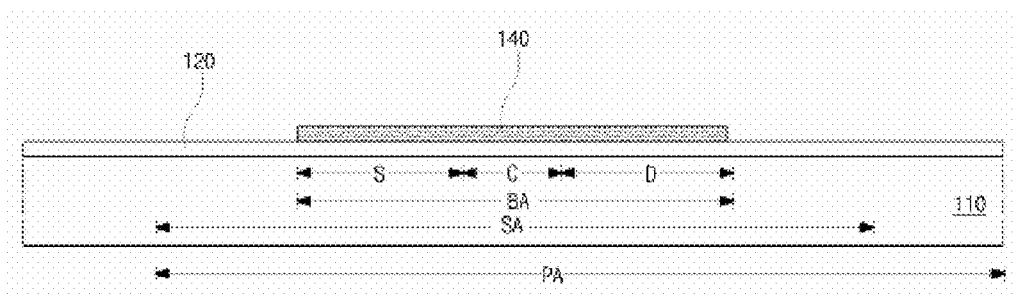

In FIG. 6B, the amorphous silicon layer 140a of FIG. 6A is crystallized and patterned to form an active layer 140. The amorphous silicon layer 140a may be crystallized using one of a solid phase crystallization (SPC) method, a sequential lateral solidification (SLS) method, a metal induced crystallization (MIC) method, a metal induced lateral crystallization (MILC) method, and an alternative magnetic lateral crystallization (AMLC) method. The buffer layer 120 prevents the amorphous silicon layer 140 from being contaminated by impurities included in the substrate 110 while depositing the amorphous silicon by the PCVD method and crystallizing the amorphous silicon layer 140a.

Figure 6C:
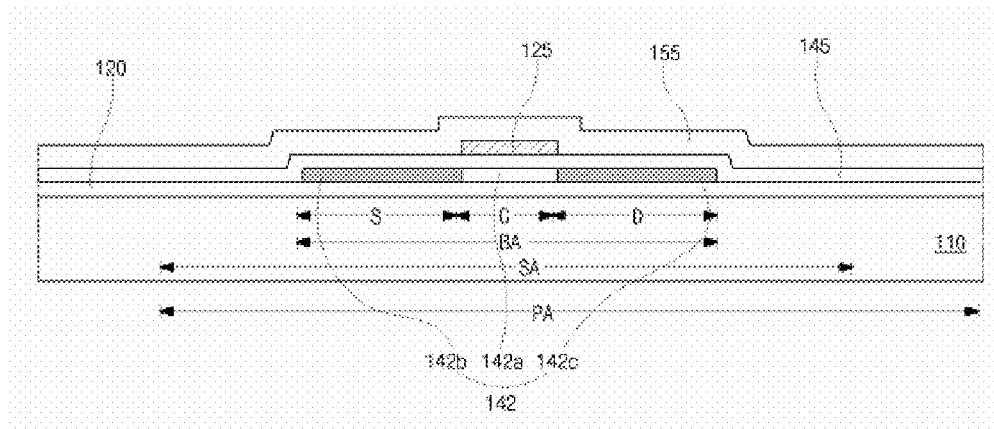

In FIG. 6C, a gate insulating layer 145 is formed on the active layer 140 of FIG. 6B. The gate insulating layer 145 is formed of an inorganic insulating material group, such as silicon oxide ($SiO_2$) and silicon nitride ($SiN_X$). Next, a metallic layer (not shown) is formed on the gate insulating layer 145 and patterned to thereby form a gate line (not shown) and a gate electrode 125. The gate line is supplied with scan signals along a direction. The gate electrode 125 extends from the gate line and is disposed in the channel area C. The gate line and the gate electrode 125 may be formed of a conductive metallic material group, such as including copper (Cu), molybdenum (Mo), aluminum (Al), or an aluminum alloy such as aluminum neodymium (AlNd).

The active layer 140 of FIG. 6B corresponding to the source and drain areas S and D is doped with negative- or positive-type impurities using the gate electrode 125 as a doping mask, thereby forming a semiconductor layer 142. The semiconductor layer 42 includes a channel portion 142a that does not have the impurities, and first and second doped portions 142b and 142c that have the impurities. The channel portion 142a corresponds to the gate electrode 125, and the first and second doped portions 142b and 142c are disposed at both sides of the channel portion 142a.

Next, a passivation layer 155 is formed substantially on the entire surface of the substrate 110 including the gate line and the gate electrode 125. The passivation layer 155 is formed of an inorganic insulating material group, such as silicon oxide ($SiO_2$) or silicon nitride ($SiN_X$), or an organic insulating material group, such as photo acryl or benzocyclobutene (BCB). The passivation layer 155 may be double layers of silicon nitride and silicon oxide sequentially deposited.

Figure 6D:
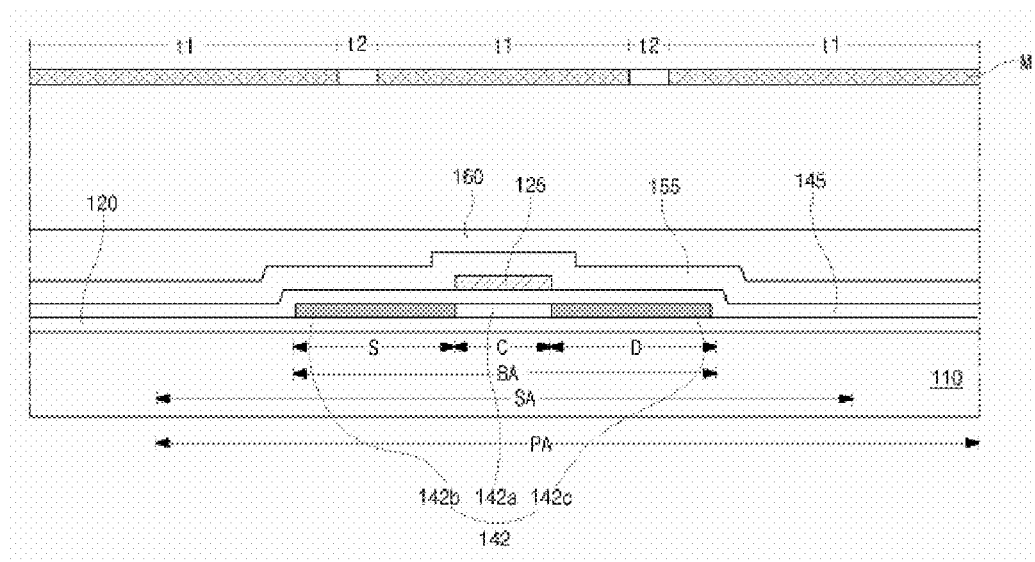

In FIG. 6D, a photoresist layer 160 is formed on the substrate 110 including the passivation layer 155 by applying photoresist. A mask M including a light-blocking portion t1 and a light-transmitting portion t2 is disposed over the photoresist layer 160. The light-blocking portion t1 completely screens light, and the light-transmitting portion t2 transmits light such that the photoresist layer 160 exposed to the light is chemically changed. Here, the light-transmitting portion t2 corresponds to parts of the source area S and the drain area D, and the light-blocking portion t1 corresponds to other areas excluding the parts of the source area S and the drain area D.

Figure 6E:
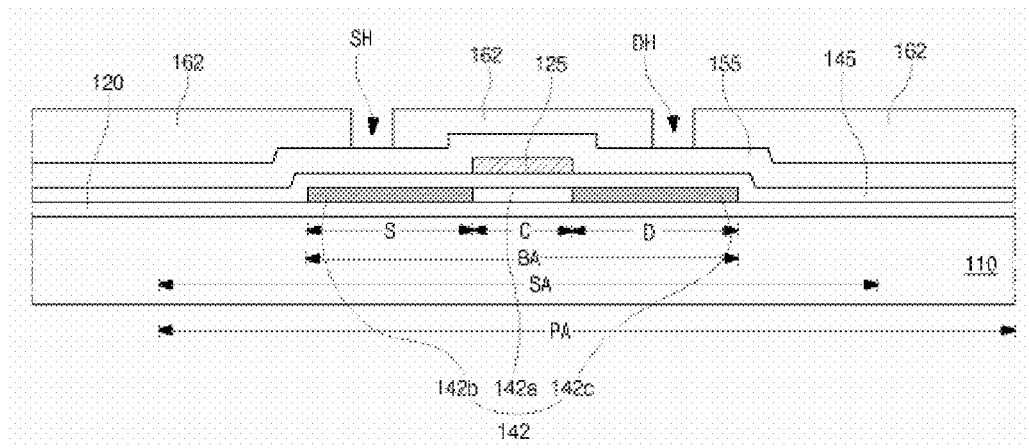

In FIG. 6E, the photoresist layer 160 of FIG. 6D is exposed to light through the mask M of FIG. 6D using a light exposure and is developed to remove the photoresist layer 160 of FIG. 6D corresponding to the parts of the source and drain areas S and D. Then, photoresist patterns 162 are formed, and the passivation layer 155 is exposed between the photoresist patterns 162.

Figure 6F:
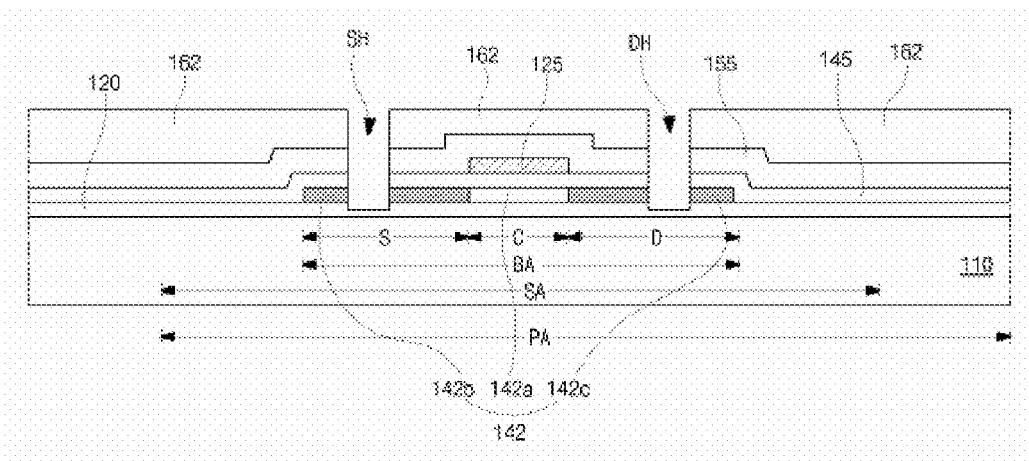

In FIG. 6F, the passivation layer 155, the gate insulating layer 145 and the semiconductor layer 142 corresponding to the source and drain areas S and D are removed by a plasma dry-etching apparatus at a time using the photoresist patterns 162 as an etching mask, and source and drain holes SH and DH having a first width W1 are formed. Here, sulfur hexafluoride ($SF_6$) and argon (Ar) may be used as reaction gases, and process time may be within a range of 90 seconds to 110 seconds. The reaction gases, including $SF_6$ and Ar, react with silicon nitride ($SiN_X$), silicon oxide ($SiO_2$) and silicon (Si) well. At this time, the first and second doped portions 142b and 142c corresponding to the source and drain areas S and D are also removed by the first width W1, and the buffer layer 120 under the first and second doped portions 142b and 142c is partially removed.

Figure 6G:
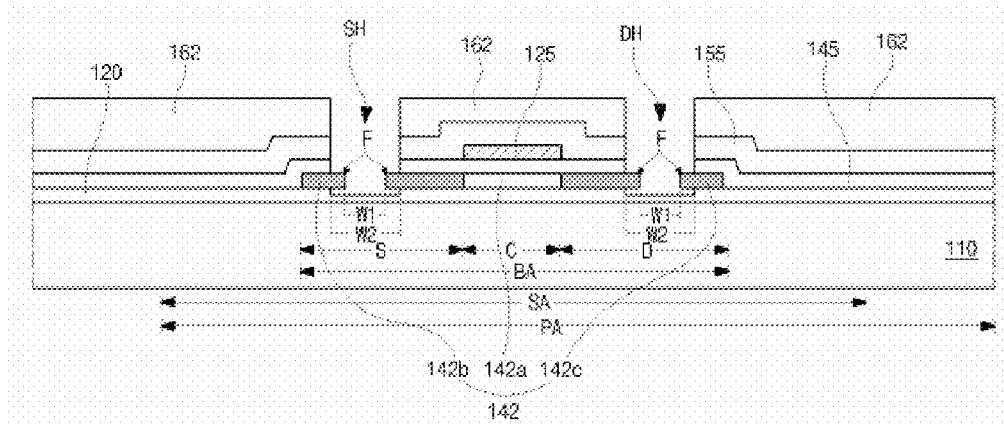

Next, in FIG. 6G, the source and drain holes SH and DH of FIG. 6F having the first width W1 are treated by a buffer oxide etchant (BOE), and the source and drain holes SH and DH have a second width W2 wider than W1. BOE treatment is a wet etch using etchant, and the BOE treatment may be performed for 20 seconds or 40 seconds, and more desirably, for 30 seconds, because long BOE treatment can remove the semiconductor layer 142. The BOE scarcely reacts with silicon (Si) while the BOE actively reacts with the passivation layer 155, the gate insulating layer 145 and the buffer layer 120. Therefore, the source and drain holes SH and DH have the second width W2, and the first and second doped portions 142b and 142c still have the first width W1. Accordingly, an upper surface, a lower surface and a side surface of each of the first and second doped portions 142b and 142c are exposed, and the first and second doped portions 142b and 142c have protrusions F.

Figure 6H:
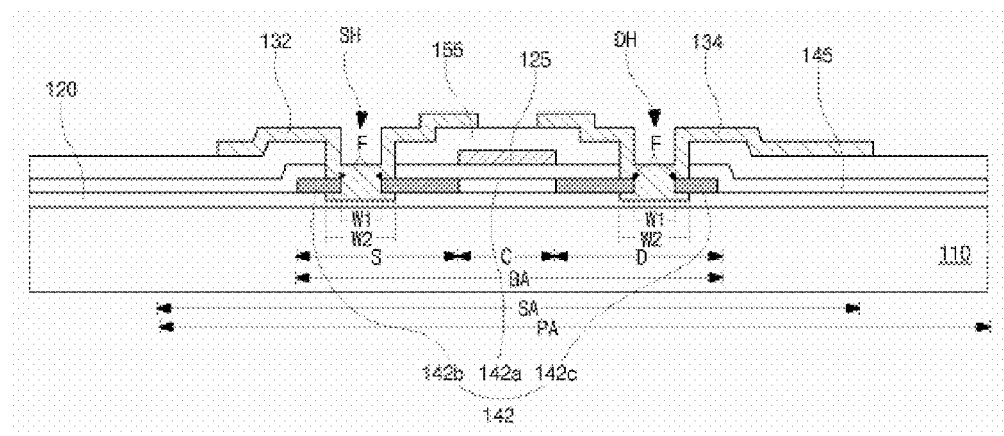

In FIG. 6H, a data line (not shown), a source electrode 132 and a drain electrode 134 are formed on the passivation layer 155 including the source and drain holes SH and DH by forming a source and drain metallic layer (not shown) and patterning the source and drain metallic layer. The data line perpendicularly crosses the gate line to define the pixel region PA. The source electrode 132 extends from the data line and contacts the first doped portion 142b through the source hole SH. The drain electrode 134 is spaced apart from the source electrode 132 and contacts the second doped portion 142c through the drain hole DH. The source and drain metallic layer may be formed of a conductive material group, such as molybdenum (Mo), an aluminum alloy such as AlNd or p-Al, titanium (Ti), tantalum (Ta), a titanium alloy such as TiN, indium tin oxide (ITO), or indium zinc oxide (IZO).

Figure 6I:
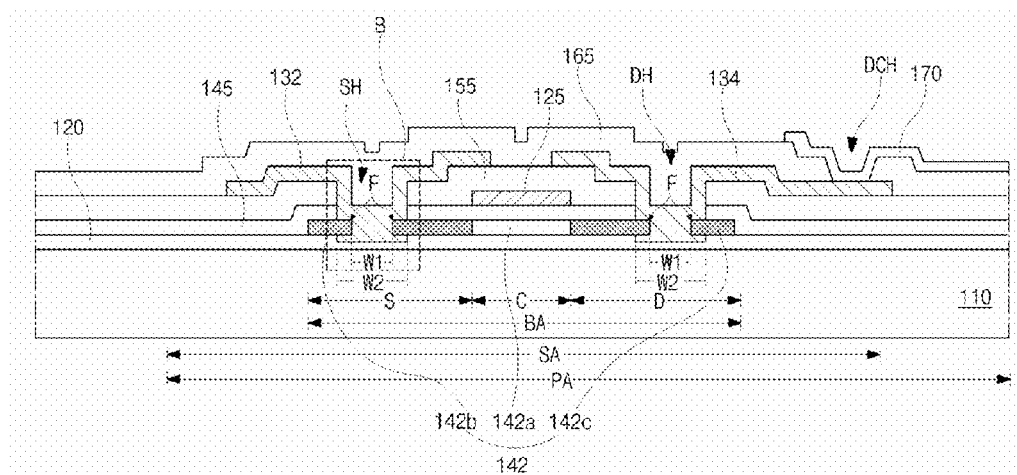

In FIG. 6I, an interlayer insulating layer 165 is formed on the substrate 110 including the source and drain electrodes 132 and 134. The interlayer insulating layer 165 includes a drain contact hole DCH exposing the drain electrode 134. The interlayer insulating layer 165 may be formed of an inorganic insulating material group such as silicon oxide ($SiO_2$) or silicon nitride ($SiN_x$), or an organic insulating material group such as photo acryl and benzocyclobutene (BCB). A pixel electrode 170 is formed in the pixel region PA on the interlayer insulating layer 165 and is connected to the drain electrode 134 through the drain contact hole DCH. The pixel electrode 170 may be formed of a transparent conductive material group such as indium tin oxide (ITO) or indium zinc oxide (IZO). In this manner, a thin film transistor according to the present invention can be manufactured.

Figure 7:
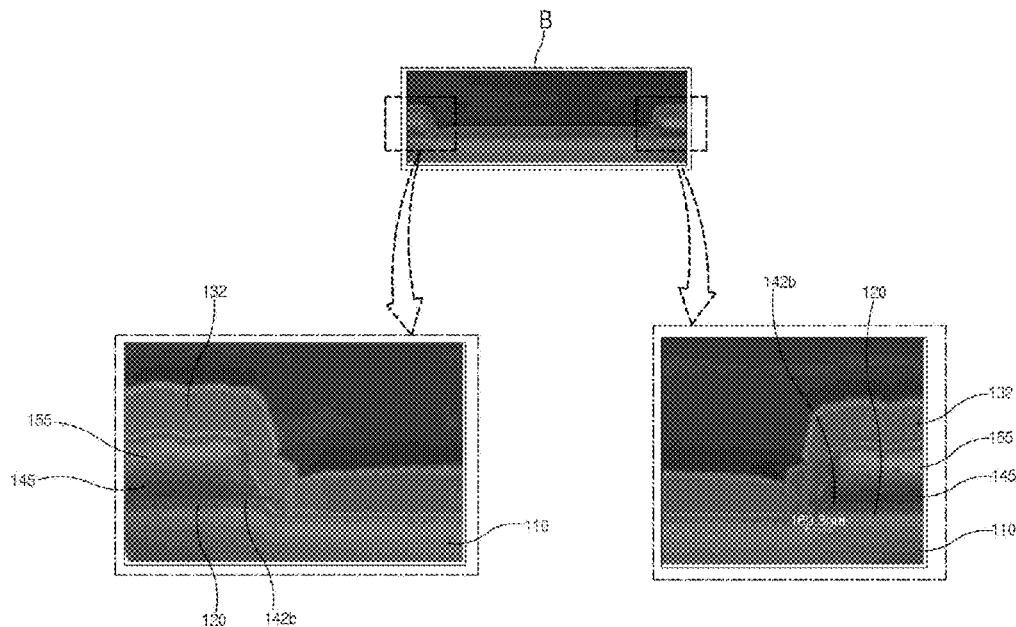
FIG. 7 is a photo illustrating a cross-section of region B in FIG. 6I.

FIG. 7 is a photo illustrating a cross-section enlarging the region B of FIG. 6I. FIG. 7 shows the source area S in which the buffer layer 120, the first doped portion 142b, the gate insulating layer 145, the passivation layer 155 and the source electrode 132 are sequentially formed. In FIG. 7, the protrusions F are shown beyond the buffer layer 120, the gate insulating layer 145 and the passivation layer 155 and at facing inner sides of the first doped portion 142b. A contact area between the first doped portion 142b and the source electrode 132 is increased due to the protrusions F, and reliability of the thin film transistor is not affected even if the source electrode 132 makes a side contact with the first doped portion 142b. In addition, since the source and drain holes are formed by a dry etch method using only $SF_6$ and Ar, by-products or particles are minimized. Accordingly, contact problems are decreased, and the production yield is improved.

The thin film transistor and the method of manufacturing the thin film transistor according to the present invention may be applied to a semiconductor device including a thin film transistor such as a liquid crystal display device or an organic electroluminescent display device. Moreover, the thin film transistor and the method of manufacturing the thin film transistor according to the present invention may be applied to one including amorphous silicon as well as polycrystalline silicon as the active layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film transistor, comprising:
    forming a silicon layer on a substrate;
    forming a gate insulating layer on the silicon layer and the substrate;
    forming a gate electrode on the gate insulating layer over the silicon layer; and
    implanting impurities into the silicon layer to define source and drain regions and to define a channel region under the gate electrode;
    forming a passivation layer on the gate electrode and the gate insulating layer;
    performing a first etch process to form first and second contact holes through the passivation layer, the gate insulating layer, and the silicon layer;
    performing a second etch process to widen the first and second contact holes at the passivation layer and the gate insulating layer by an amount greater than at the silicon layer;
    forming a source electrode in contact with the source region via the first contact hole; and
    forming a drain electrode in contact with the drain region via the second contact hole.

2. The method according to claim 1, wherein the substrate includes a buffer layer at an upper surface thereof, wherein the step of forming the semiconductor layer forms the semiconductor layer directly on the buffer layer, wherein the first etch process further forms the first and second contact holes into the buffer layer, and wherein the second etch process further widens the first and second contact holes at the buffer layer.

3. The method according to claim 1, wherein the step of performing the first etch process includes forming a photoresist mask on the passivation layer so that portions of the passivation layer above the source region and drain region are exposed.

4. The method according to claim 3, wherein the step of performing the first etch process includes a plasma dry etch process using sulfur hexafluoride ($SF_6$) and argon.

5. The method according to claim 1, wherein, in the step of performing the second etch process, an etchant is used having a greater reactivity with the passivation layer and the gate insulating layer than with the silicon layer.

6. The method according to claim 5, wherein the etchant of the second etch process includes a buffer oxide etchant.

7. The method according to claim 5, wherein, following the second etch process, a width of the first contact hole at the semiconductor layer is less than a width of the first contact hole at the gate insulating layer, and a width of the second contact hole at the semiconductor layer is less than a width of the second contact hole at the gate insulating layer.

8. The method according to claim 1, wherein the step of forming the silicon layer includes forming a layer of amorphous silicon on the substrate and crystallizing the amorphous silicon to form a polycrystalline silicon thin film.

9. The method according to claim 1, wherein, in the implanting step, the gate electrode is used as a mask for the channel region.

10. The method according to claim 1, wherein the width of the first and second contact holes remains substantially constant during the step of performing the second etch process.

11. A method of fabricating a thin film transistor, comprising:
    forming a silicon layer on a substrate;
    forming a gate insulating layer on the silicon layer;
    forming a gate electrode on the gate insulating layer over the silicon layer;
    doping the silicon layer with impurities to form a semiconductor layer including a channel portion under the gate electrode and first and second doped portions respectively disposed at sides of the channel portion;
    forming a passivation layer on the semiconductor layer;
    forming source and drain holes by patterning the passivation layer, the gate insulating layer and the first and second doped portions, wherein the source hole has a first width at the first doped portion and a second width at the gate insulating layer with the second width being greater than the first width, and wherein the drain hole has a third width at the second doped portion and a fourth width at the gate insulating layer with the fourth width being greater than the third width; and forming source and drain electrodes on the passivation layer, the source electrode connected to the first doped portion through the source hole, and the drain electrode connected to the second doped portion through the drain hole.

12. The method according to claim 11, wherein the substrate includes a buffer layer at an upper surface thereof, and wherein the step of forming the semiconductor layer forms the semiconductor layer directly on the buffer layer.

13. The method according to claim 12, wherein forming source and drain holes includes partially removing the buffer layer corresponding to the source and drain holes and wherein the source and drain holes at the buffer layer have second and fourth widths, respectively.

14. The method according to claim 13, wherein the first and second doped portions protrude into the source and drain holes relative to the buffer layer and the gate insulating layer.

15. The method according to claim 11, wherein the step of forming the silicon layer includes:
    forming an amorphous silicon layer on a substrate;
    crystallizing the amorphous silicon layer to form a polycrystalline silicon layer; and
    patterning the polycrystalline silicon layer to form an active layer having an island shape.

16. The method according to claim 15, wherein the amorphous silicon layer is crystallized using one of a solid phase crystallization (SPC) method, a sequential lateral solidification (SLS) method, a metal induced crystallization (MIC) method and an alternative magnetic lateral crystallization (AMLC) method.

17. The method according to claim 11, wherein the first and second doped portions include one of n-type or p-type impurities.

18. The method according to claim 11, wherein the step of forming the source and drain holes includes:
    a first patterning step of etching the passivation layer, the gate insulating layer and the first and second doped portions to have the first and third widths; and
    a second patterning step of etching the passivation layer and the gate insulating layer such that the source and drain holes have the second and fourth widths.

19. The method according to claim 11, wherein the first patterning step is performed using sulfur hexafluoride ($SF_6$) and argon (Ar) for 90 seconds to 110 seconds.

20. The method according to claim 11, wherein the second patterning step is performed using a buffer oxide etchant (BOE) for 20 seconds to 40 seconds.

21. A method of fabricating an array substrate for a liquid crystal display device, comprising:
    forming a silicon layer on a substrate;
    forming a gate insulating layer on the silicon layer;
    forming a gate line and a gate electrode on the gate insulating layer, the gate electrode connected to the gate line and disposed over the silicon layer;
    doping the silicon layer with impurities to form a semiconductor layer including a channel portion under the gate electrode and first and second doped portions respectively disposed at sides of the channel portion;
    forming a passivation layer on the semiconductor layer;
    forming source and drain holes by patterning the passivation layer, the gate insulating layer and the first and second doped portions, wherein the source hole has a first width at the first doped portion and a second width at the gate insulating layer with the second width being greater than the first width, and wherein the drain hole has a third width at the second doped portion and a fourth width at the gate insulating layer with the fourth width being greater than the third width;
    forming a data line and source and drain electrodes on the passivation layer, the data line crossing the gate line to define a pixel region, the source electrode extending from the data line and connected to the first doped portion through the source hole, and the drain electrode spaced apart from the source electrode and connected to the second doped portion through the drain hole;
    forming an interlayer insulating layer on the data line, the source electrode and the drain electrode, the interlayer insulating layer including a drain contact hole exposing the drain electrode; and
    forming a pixel electrode on the interlayer insulating layer, the pixel electrode being connected to the drain electrode through the drain contact hole.

22. The method according to claim 21, wherein the substrate includes a buffer layer at an upper surface thereof, and wherein the step of forming the semiconductor layer forms the semiconductor layer directly on the buffer layer.

* * * * *